（12） United States Patent
Endo et al.

(10) Patent No.: US 11,821,963 B2
(45) Date of Patent: Nov. 21, 2023

(54) MAGNETIC SENSOR (71) Applicant: SHOWA DENKO K.K., Tokyo (JP)

(72) Inventors: Daizo Endo, Ichihara (JP); Akira Sakawaki, Ichihara (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 17/701,968

(22) Filed: Mar. 23, 2022

(65) Prior Publication Data
US 2022/0308128 A1 Sep. 29, 2022

(30) Foreign Application Priority Data

Mar. 26, 2021 (JP) ................................. 2021-053644

(51) Int. Cl.
*G01R 33/06* (2006.01)
(52) U.S. Cl.
CPC .................................. *G01R 33/063* (2013.01)
(58) Field of Classification Search
CPC ............ G01R 33/063; G01R 33/0052; G01R 33/038; G01R 33/0005; H01F 10/132; H01F 10/3218
USPC ........................................................ 324/244
See application file for complete search history.

(56) References Cited

U.S. PATENT DOCUMENTS

| 2009/0284254 | A1* | 11/2009 | Kasajima | G01R 33/09 |
| | | | | 324/252 |
| 2010/0007339 | A1* | 1/2010 | Ausserlechner | G01P 3/487 |
| | | | | 324/207.21 |
| 2010/0007343 | A1* | 1/2010 | Mao | H01F 10/265 |
| | | | | 324/249 |

FOREIGN PATENT DOCUMENTS

| JP | 2008-249406 A | 10/2008 |
| JP | 6498261 B1 * | 4/2019 |
| WO | WO-2009138607 A1 * | 11/2009 |
| WO | WO-2009151047 A1 * | 12/2009 |
| WO | WO-2010013690 A1 * | 2/2010 |
| WO | WO-2010097932 A1 * | 9/2010 |

OTHER PUBLICATIONS

Translation of JP-6498261-B1 (Year: 2019) (Year: 2019).*
Morikawa, Takeshi, et al. "Giant magneto-impedance effect in layered thin films." IEEE Transactions on Magnetics 33.5 (1997): 4367-4372.) (Year: 1997).*

* cited by examiner

*Primary Examiner* — Christopher P McAndrew
(74) *Attorney, Agent, or Firm* — Sughrue Mion, PLLC (57) ABSTRACT

A magnetic sensor 1 includes: a non-magnetic substrate 10; and a sensitive element 30 disposed on the substrate 10. The sensitive element 30 has a longitudinal direction and a transverse direction and has a uniaxial magnetic anisotropy in a direction intersecting the longitudinal direction. The sensitive element 30 is configured to sense a magnetic field by a magnetic impedance effect. The sensitive element 30 includes a soft magnetic material layer 101 made of an amorphous alloy based on Co and having a saturation magnetization of greater than or equal to 300 emu/cc and less than or equal to 650 emu/cc.

10 Claims, 7 Drawing Sheets

MAGNETIC SENSOR

CROSS REFERENCE TO RELATED APPLICATIONS

This application is based on and claims priority under 35 USC § 119 to Japanese Patent Application No. 2021-053644 filed Mar. 26, 2021, the disclosure is incorporated herein by reference in its entirety.

BACKGROUND

Technical Field

The present invention relates to a magnetic sensor.

Related Art

A previous publication in the art discloses a magnetic impedance effect element including: a thin-film magnet composed of a hard magnetic material film formed on a non-magnetic substrate; an insulating layer covering the thin-film magnet; and a magneto-sensitive portion composed of one or more rectangular soft magnetic material films with uniaxial anisotropy formed on the insulating layer (see Patent Document 1).

CITATION LIST

Patent Literature

Patent Document 1: Japanese Patent Application Laid-Open Publication No. 2008-249406

SUMMARY

A magnetic sensor including a sensitive element to sense a magnetic field by a magnetic impedance effect utilizes changes in impedance relative to the magnetic field. To improve sensitivity of the magnetic sensor, it is required to ensure large impedance changes relative to the magnetic field.

It is an object of certain embodiments of the present invention to improve the sensitivity of the magnetic sensor that uses the magnetic impedance effect.

A magnetic sensor according to certain embodiments of the present invention includes: a non-magnetic substrate; and a sensitive element disposed on the substrate. The sensitive element has a longitudinal direction and a transverse direction and has a uniaxial magnetic anisotropy in a direction intersecting the longitudinal direction. The sensitive element is configured to sense a magnetic field by a magnetic impedance effect. The sensitive element includes a soft magnetic material layer made of an amorphous alloy based on Co and having a saturation magnetization of greater than or equal to 300 emu/cc and less than or equal to 650 emu/cc.

The soft magnetic material layer may have a saturation magnetization of greater than or equal to 300 emu/cc and less than or equal to 550 emu/cc.

The soft magnetic material layer may have a saturation magnetization of greater than or equal to 300 emu/cc and less than or equal to 450 emu/cc.

A magnetic sensor according to certain other embodiments of the present invention includes: a non-magnetic substrate; and a sensitive element disposed on the substrate. The sensitive element has a longitudinal direction and a transverse direction and has a uniaxial magnetic anisotropy in a direction intersecting the longitudinal direction. The sensitive element is configured to sense a magnetic field by a magnetic impedance effect. The sensitive element includes a soft magnetic material layer made of an amorphous alloy containing 3 at % Zr and greater than or equal to 17 at % and less than 21 at % Nb with a balance of Co.

The soft magnetic material layer may contain greater than 17 at % and less than 21 at % Nb.

The soft magnetic material layer may contain greater than 18 at % and less than 21 at % Nb.

In the above magnetic sensors, the sensitive element may include plural soft magnetic material layers, and may include a magnetic domain suppression layer between the plural soft magnetic material layers. The magnetic domain suppression layer is configured to suppress generation of closure magnetic domains in the soft magnetic material layers.

The sensitive element may include plural soft magnetic material layers, and may include a non-magnetic conductor layer between the plural soft magnetic material layers. The conductor layer has higher conductivity than the soft magnetic material layers.

The sensitive element may include plural soft magnetic material layers, and may include a non-magnetic antiferromagnetic coupling layer between the plural soft magnetic material layers. The antiferromagnetic coupling layer is configured to antiferromagnetically couple the soft magnetic material layers.

Certain embodiments of the present invention improve the sensitivity of the magnetic sensor that uses the magnetic impedance effect.

BRIEF DESCRIPTION OF THE DRAWINGS

Exemplary embodiments of the present invention will be described in detail based on the following figures, wherein:

FIGS. 1A and 1B illustrate an example of a magnetic sensor according to an embodiment, where

FIG. 4A illustrates the relationship with the sensitivity and FIG. 4B illustrates the relationship with the anisotropic magnetic field;

FIGS. 7A to 7C are cross-sectional views of some modifications of the magnetic sensor, where

DETAILED DESCRIPTION

An exemplary embodiment of the present invention (hereinafter referred to as the "present embodiment") will be described below with reference to the attached drawings.

(Configuration of a Magnetic Sensor 1)

Figure 1A:
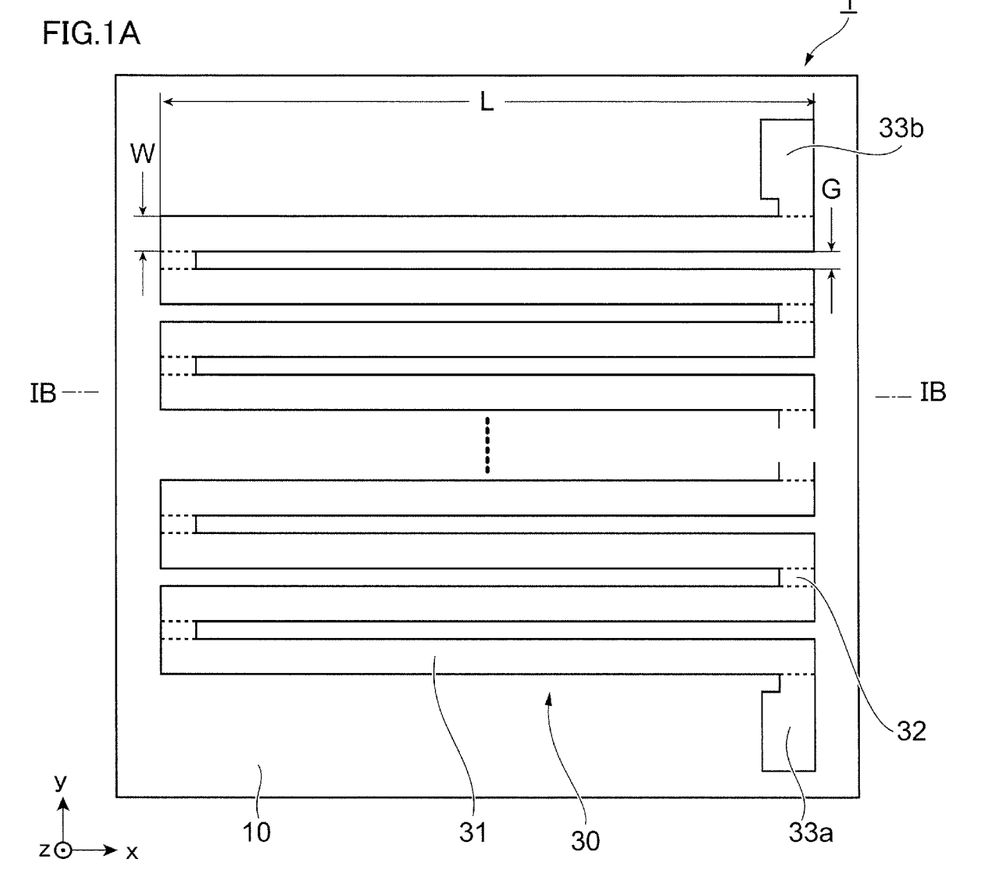
FIG. 1A is a plan view.
Figure 1B:
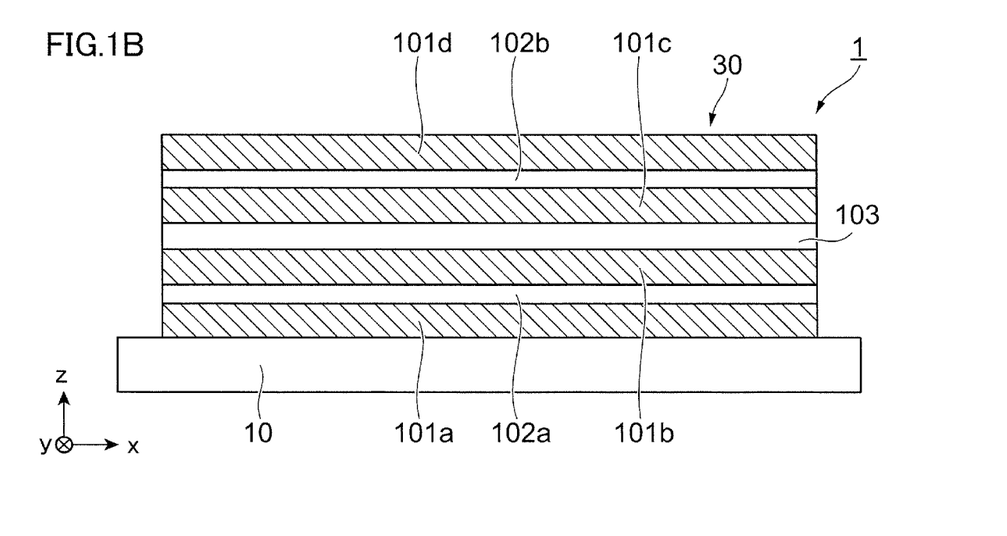
FIG. 1B is a cross-sectional view taken along the line IB-IB in FIG. 1A.

FIGS. 1A and 1B illustrate an example of a magnetic sensor 1 according to the present embodiment, where FIG. 1A is a plan view, and FIG. 1B is a cross-sectional view taken along the line IB-IB in FIG. 1A. In FIG. 1A, the right direction in the page corresponds to the x direction, the upward direction in the page corresponds to the y direction, and the direction coming out of the page corresponds to the z direction. In FIG. 1B, the right direction in the page corresponds to the x direction, the upward direction in the page corresponds to the z direction, and the direction going into the page corresponds to the y direction.

As shown in FIG. 1B, the magnetic sensor 1 according to the present embodiment includes a non-magnetic substrate 10 and a sensitive element 30 disposed on the substrate 10 and including soft magnetic material layers to sense a magnetic field.

A cross-sectional structure of the magnetic sensor 1 shown in FIG. 1B will be detailed in subsequent paragraphs.

A soft magnetic material refers to a so-called low coercivity material that is easily magnetizable by an external magnetic field but quickly returns to a non-magnetized or low magnetized state upon removal of the external magnetic field.

Referring to FIG. 1A, a planar structure of the magnetic sensor 1 is described. By way of example, the magnetic sensor 1 has a quadrangular planar shape. Each side of the planar shape of the magnetic sensor 1 is several millimeters in length. For example, the length in the x direction is from 4 mm to 6 mm, and the length in the y direction is from 3 mm to 5 mm. Note that the size of the planar shape of the magnetic sensor 1 may have any other values. Also, the magnetic sensor 1 may have any other planar shape than quadrangles.

The sensitive element 30 disposed on the substrate 10 is now described. The sensitive element 30 includes plural sensitive portions 31 each being of a strip-like planar shape having longitudinal and transverse directions. In FIG. 1A, the x direction corresponds to the longitudinal direction of the sensitive element 30. The plural sensitive portions 31 are arranged such that their longitudinal directions are parallel to each other. The sensitive element 30 includes: connecting portions 32 connecting respective adjacent sensitive portions 31 in series in a serpentine pattern; and terminal portions 33 connected with electric wires for electric current supply. The sensitive portions 31 sense a magnetic field or any changes in the magnetic field to produce a magnetic impedance effect. In other words, the magnetic field or any changes in the magnetic field are measured using changes in the impedance of the sensitive element 30, in which the sensitive portions 31 are connected in series. Hereinafter, the impedance of the sensitive element 30 may be referred to as impedance of the magnetic sensor 1.

While FIG. 1A depicts eight sensitive portions 31, the number of sensitive portions 31 is not limited to eight. Accordingly, FIG. 1A depicts a dashed line between the four sensitive portions 31 in the upper side of the page and the four sensitive portions 31 in the lower side of the page to indicate that the number of sensitive portions 31 is not limited to eight.

Each connecting portion 32 is disposed between ends of respective adjacent sensitive portions 31 to connect the respective adjacent sensitive positions 31 in series in a serpentine pattern.

The terminal portions 33 (terminal portions 33a, 33b) are disposed at two respective ends of the sensitive portions 31 that are not connected with any connecting portion 32. The terminal portions 33 serve as pad portions to be connected with electric wires for electric current supply. The terminal portions 33 may have a size that allows for connection of the electric wires. While the terminal portions 33 (terminal portions 33a, 33b) are disposed on the right side in the page of FIG. 1A, both of the terminal portions 33 may be disposed on the left side, or one and the other of the terminal portions 33 may be respectively disposed on the right and left sides.

Here, a length of the sensitive portion 31 in the longitudinal direction (x direction) is defined as a length L. A width of the sensitive portion 31 in the transverse direction is defined as a width W. A gap between two adjacent sensitive portions 31 is defined as a gap G. For example, the length L of the sensitive portion 31 is from 1 mm to 10 mm, the width W is from 10 μm to 150 μm, and the gap G is from 10 μm to 150 μm. Note that the size (length L, width W, thickness, etc.) of each sensitive portion 31, the number of sensitive portions 31, the gap G between the sensitive portions 31, and other parameters may be set depending on the size of the magnetic field to be sensed (i.e., measured) and other factors. Only one sensitive portion 31 may be provided.

Now referring to FIG. 1B, a cross-sectional structure of the magnetic sensor 1 is described.

The substrate 10 is made of a non-magnetic material. Examples of the substrate 10 include an oxide substrate such as glass and sapphire, a semiconductor substrate such as silicon, and a metal substrate such as aluminum, stainless steel, and a metal plated with nickel phosphorus. When the substrate 10 is highly conductive, an insulator layer providing electrical insulation between the substrate 10 and the sensitive element 30 may be disposed at the surface of the substrate 10 on which the sensitive element 30 is to be disposed. Examples of insulators constituting the insulator layer include oxides such as $SiO_2$, $Al_2O_3$, and $TiO_2$, and nitrides such as $Si_3N_4$ and AlN. Here, the substrate 10 is described as being a glass substrate.

By way of example, the sensitive element 30 includes four soft magnetic material layers 101a, 101b, 101c, 101d in this order from closest to farthest from the substrate 10. Between the soft magnetic material layers 101a and 101b, the sensitive element 30 includes a magnetic domain suppression layer 102a to suppress generation of closure magnetic domains in the soft magnetic material layers 101a and 101b. Between the soft magnetic material layers 101c and 101d, the sensitive element 30 further includes a magnetic domain suppression layer 102b to suppress generation of closure magnetic domains in the soft magnetic material layers 101c and 101d. The sensitive element 30 further includes a conductor layer 103 between the soft magnetic material layers 101b and 101c to reduce resistance (herein, electric resistance) of the sensitive element 30. Hereinafter, the soft magnetic material layers 101a, 101b, 101c, 101d are collectively referred to as the soft magnetic material layers 101 unless the distinction is necessary. The magnetic domain suppression layers 102a and 102b are collectively referred to as the magnetic domain suppression layers 102 unless the distinction is necessary.

Each soft magnetic material layer 101 is composed of a soft magnetic material of an amorphous alloy that provides a magnetic impedance effect. For example, the soft magnetic material layer 101 has a thickness of from 100 nm to 1 µm. The soft magnetic material layer 101 of the sensitive element 30 according to the present embodiment is composed of a soft magnetic material of an amorphous alloy based on Co having a saturation magnetization of greater than or equal to 300 emu/cc and less than or equal to 650 emu/cc. The soft magnetic material layers 101 will be detailed in subsequent paragraphs.

As used herein, an amorphous alloy or amorphous metal refers to any alloy or metal that has a structure having no regular arrangement of atoms such as in crystals and is formed by sputtering or similar methods.

Each magnetic domain suppression layer 102 suppresses generation of closure magnetic domains in the corresponding upper and lower soft magnetic material layers 101 sandwiching the magnetic domain suppression layer 102.

Generally, plural magnetic domains having different magnetization directions are often formed in the soft magnetic material layers 101. This leads to formation of closure magnetic domains making an annular magnetization direction. As an external magnetic field increases, magnetic domain walls move. As a result, an area of the magnetic domain whose magnetization direction is the same as the direction of the external magnetic field increases, while an area of the magnetic domain whose magnetization direction is opposite to the direction of the external magnetic field decreases. As the external magnetic field increases further, magnetization rotation takes place in the magnetic domain whose magnetization direction is different from the direction of the external magnetic field, whereby the magnetization direction of that domain is oriented in the same direction as the external magnetic field. Finally, the magnetic domain wall that has existed between adjacent magnetic domains disappears, and the adjacent magnetic domains combine into a magnetic domain (a single magnetic domain). In other words, when the closure magnetic domains are formed, a Barkhausen effect takes place due to the changes in the external magnetic field, whereby the magnetic domain walls constituting the closure magnetic domains move in a stepwise and discontinuous manner. The discontinuous movements of the magnetic domain walls would produce noise in the magnetic sensor 1, which may reduce the S/N ratio in the output obtained from the magnetic sensor 1. Each magnetic domain suppression layer 102 suppresses formation of plural magnetic domains with small areas in the corresponding soft magnetic material layers 101 on and under the magnetic domain suppression layer 102. This suppresses formation of the closure magnetic domains, which in turn suppresses the noise that might otherwise be produced from discontinuous movements of the magnetic domain walls. Note that the magnetic domain suppression layers 102 may at least serve to reduce the number of magnetic domains formed, i.e., increase the size of each magnetic domain, as compared to an absence of the magnetic domain suppression layers 102.

Examples of materials for these magnetic domain suppression layers 102 include non-magnetic materials, such as Ru and $SiO_2$, and non-magnetic amorphous metals, such as CrTi, AlTi, CrB, CrTa, and CoW. The magnetic domain suppression layers 102 have a thickness of from 10 nm to 100 nm, for example.

The conductor layer 103 reduces the resistance of the sensitive element 30. Specifically, the conductor layer 103 is more conductive than the soft magnetic material layers 101 and reduces the resistance of the sensitive element 30 as compared to an absence of the conductor layer 103. The magnetic field or any changes in the magnetic field sensed by the sensitive element 30 are measured as a change in the impedance (hereinafter denoted as the impedance Z) when an alternating current is passed between the two terminal portions 33a, 33b. Hereinafter, such a change in the impedance Z is denoted as ΔZ. In this context, a higher frequency of the applied alternating current corresponds to a larger rate of change in the impedance Z relative to the change in the external magnetic field (hereinafter denoted as ΔH). Hereinafter, such a rate of change in the impedance Z relative to ΔH is denoted as an impedance change rate ΔZ/ΔH. However, increasing the frequency of the alternating current in the absence of the conductor layer 103 would instead decrease the impedance change rate ΔZ/ΔH due to the floating capacitance of the magnetic sensor 1. More specifically, assuming that the resistance of the sensitive element 30 is R, the floating capacitance is C, and the sensitive element 30 is a parallel circuit of the resistance R and the floating capacitance C, a relaxation frequency $f_0$ of the magnetic sensor 1 can be expressed by Expression (1) below.

[Expression 1]

$$f_0 = \frac{1}{2\pi RC} \quad (1)$$

As can be understood from Expression (1), a larger floating capacitance C corresponds to a smaller relaxation frequency $f_0$. Thus, if the frequency of the alternating current is higher than the relaxation frequency $f_0$, the impedance change rate ΔZ/ΔH would decrease. To avoid this, the conductor layer 103 is provided to reduce the resistance R of the sensitive element 30 and thereby increase the relaxation frequency $f_0$.

The conductor layer 103 is preferably made of a highly conductive metal or alloy, and more preferably made of a highly conductive and non-magnetic metal or alloy. Examples of materials for the conductor layer 103 include metals such as Al, Cu, Ag, and Au. The conductor layer 103 has a thickness of from 10 nm to 1 µm, for example. The conductor layer 103 may at least serve to reduce the resistance of the sensitive element 30 as compared to an absence of the conductor layer 103.

The upper and lower soft magnetic material layers 101 sandwiching the corresponding magnetic domain suppression layer 102 and the upper and lower soft magnetic material layers 101 sandwiching the conductor layer 103 are antiferromagnetically coupled (AFC) with each other. The antiferromagnetic coupling of the lower and upper soft magnetic material layers 101 suppresses a demagnetizing field, helping improve the sensitivity of the magnetic sensor 1.

The magnetic sensor 1 is manufactured as follows.

First, a photoresist pattern covering portions of the surface of the substrate 10 excluding portions corresponding to the planar shape of the sensitive element 30 is formed on the substrate 10 using any known photolithography technique. Then, the soft magnetic material layer 101a, the magnetic domain suppression layer 102a, the soft magnetic material layer 101b, the conductor layer 103, the soft magnetic material layer 101c, the magnetic domain suppression layer 102b, and the soft magnetic material layer 101d are deposited in this order on the substrate 10 using, for example, a sputtering method. Then, portions of the soft magnetic material layer 101a, the magnetic domain suppression layer 102a, the soft magnetic material layer 101b, the conductor layer 103, the soft magnetic material layer 101c, the magnetic domain suppression layer 102b, and the soft magnetic material layer 101d deposited on the photoresist are removed along with the photoresist. As a result, a laminate composed of the soft magnetic material layer 101a, the magnetic domain suppression layer 102a, the soft magnetic material layer 101b, the conductor layer 103, the soft magnetic material layer 101c, the magnetic domain suppression layer 102b, and the soft magnetic material layer 101d shaped into the planar shape of the sensitive element 30 remains on the substrate 10. In other words, the sensitive element 30 is formed.

The soft magnetic material layers 101 are provided with uniaxial magnetic anisotropy in a direction intersecting the longitudinal direction, e.g., the transverse direction (y direction in FIG. 1A). Note that the direction intersecting the longitudinal direction may be a direction angled at greater than 45 degrees and less than or equal to 90 degrees with respect to the longitudinal direction. This impartation of the uniaxial magnetic anisotropy can be done by, for example, subjecting the sensitive element 30 formed on the substrate 10 to heat treatment at 400° C. in a rotating magnetic field of 3 kG (0.3T) (heat treatment in the rotating magnetic field) and subsequent heat treatment at 400° C. in a static magnetic field of 3 kG (0.3T) (heat treatment in the static magnetic field). The impartation of the uniaxial magnetic anisotropy may be done using a magnetron sputtering method during deposition of the soft magnetic material layers 101 constituting the sensitive element 30, instead of using the heat treatment in the rotating magnetic field and the heat treatment in the static magnetic field. In other words, the magnetic field generated by magnets used in the magnetron sputtering method imparts the uniaxial magnetic anisotropy to the soft magnetic material layers 101 concurrently with the deposition thereof.

In the above manufacturing method, the connecting portions 32 and the terminal portions 33 are formed concurrently with the sensitive portions 31 as a single piece. Note that the connecting portions 32 and the terminal portions 33 may be made of a conductive metal such as Al, Cu, Ag, or Au. Alternatively, a conductive metal such as Al, Cu, Ag, or Au may be laminated on the connecting portions 32 and the terminal portions 33 formed concurrently with the sensitive portions 31 as a single piece.

(Operations of the Sensitive Element 30)

Functions of the sensitive element 30 are now described.

Figure 2:
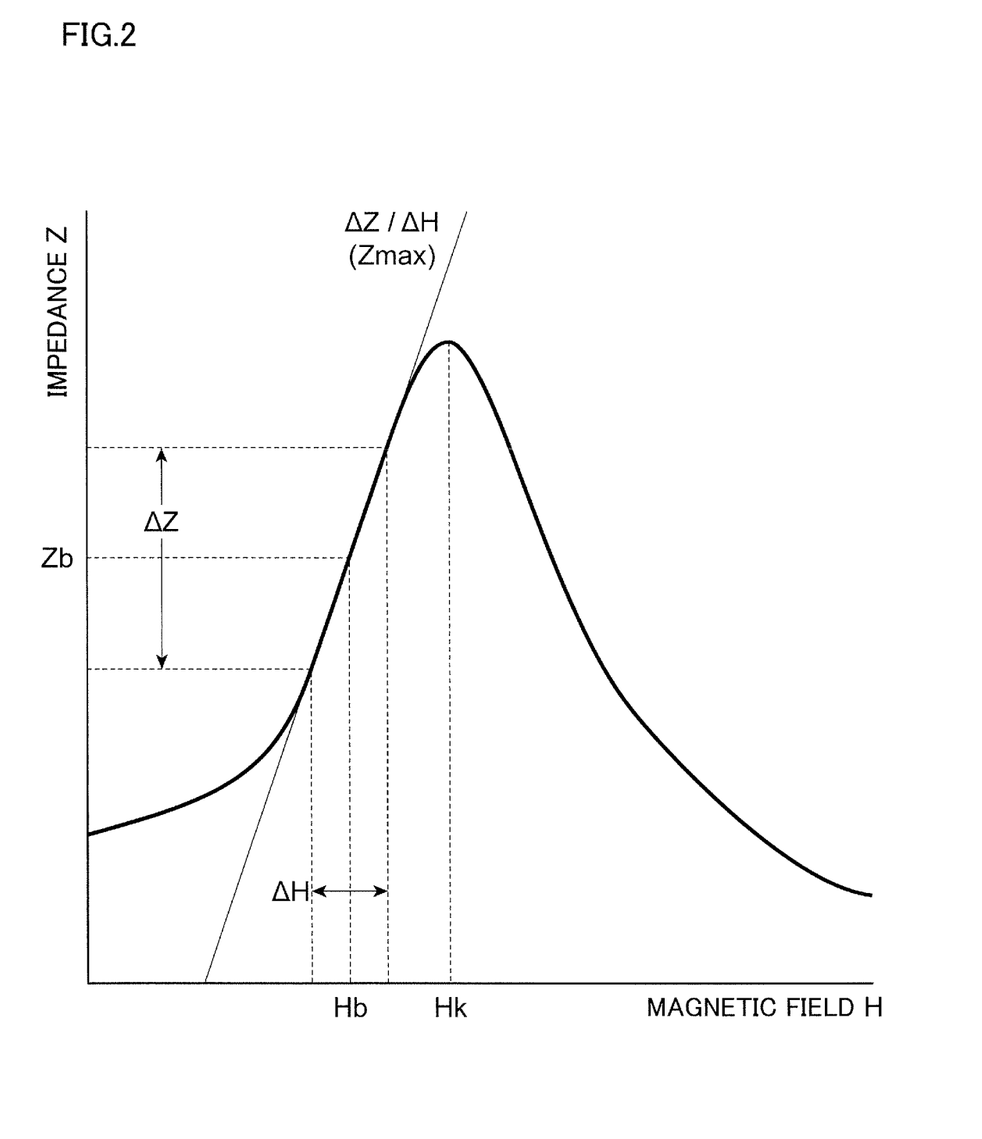
FIG. 2 illustrates relationship between a magnetic field applied in a longitudinal direction of a sensitive portion of a sensitive element and impedance of the sensitive element.

FIG. 2 shows relationship between a magnetic field H applied in the longitudinal direction (x direction in FIG. 1A) of the sensitive portion 31 of the sensitive element 30 and the impedance Z of the sensitive element 30. In FIG. 2, the horizontal axis represents the magnetic field H, and the vertical axis represents the impedance Z. Note that the impedance Z is measured by passing an alternating current between the terminal portions 33a, 33b of the sensitive element 30 shown in FIG. 1A.

As shown in FIG. 2, the impedance Z of the sensitive element 30 increases with an increase in the magnetic field H applied in the longitudinal direction of the sensitive portion 31. Once the applied magnetic field H becomes larger than an anisotropic magnetic field Hk, the impedance Z of the sensitive element 30 starts to decrease. By use of a portion where the amount of change $\Delta Z$ of the impedance Z relative to the amount of change $\Delta H$ of the magnetic field H is large, namely a portion where the impedance change rate $\Delta Z/\Delta H$ is steep (large) within the region where the applied magnetic field H is smaller than the anisotropic magnetic field Hk, a slight change in the magnetic field H can be extracted as the amount of change $\Delta Z$ of the impedance Z. In FIG. 2, the center of the portion of the magnetic field H where the impedance change rate $\Delta Z/\Delta H$ is large is denoted as a magnetic field Hb. That is, the amount of change $\Delta H$ in the magnetic field H at or near the magnetic field Hb (in the region shown by a double arrowed line in FIG. 2) can be measured with high accuracy. Here, a value obtained by dividing an amount of impedance change Zmax per unit magnetic field in the portion where the amount of change $\Delta Z$ in the impedance Z is steepest (the impedance change rate $\Delta Z/\Delta H$ is largest), i.e., in the magnetic field Hb, by the impedance Z in the magnetic field Hb (hereinafter denoted as the impedance Zb) is the sensitivity (Zmax/Zb). A higher sensitivity Zmax/Zb produces a larger magnetic impedance effect, which facilitates measurement of the magnetic field or any changes in the magnetic field. In other words, a steeper change in the impedance Z relative to the magnetic field H corresponds to a higher sensitivity Zmax/Zb. In this context, the smaller the anisotropic magnetic field Hk, the better. In other words, it is preferred that the sensitivity Zmax/Zb be higher in the magnetic sensor 1, and in this context, it is preferred that the anisotropic magnetic field Hk be smaller. The magnetic field Hb is sometimes called a bias magnetic field. Hereinafter, the magnetic field Hb is denoted as the bias magnetic field Hb.

(Method of Measuring the Sensitivity Zmax/Zb)

Figure 3:
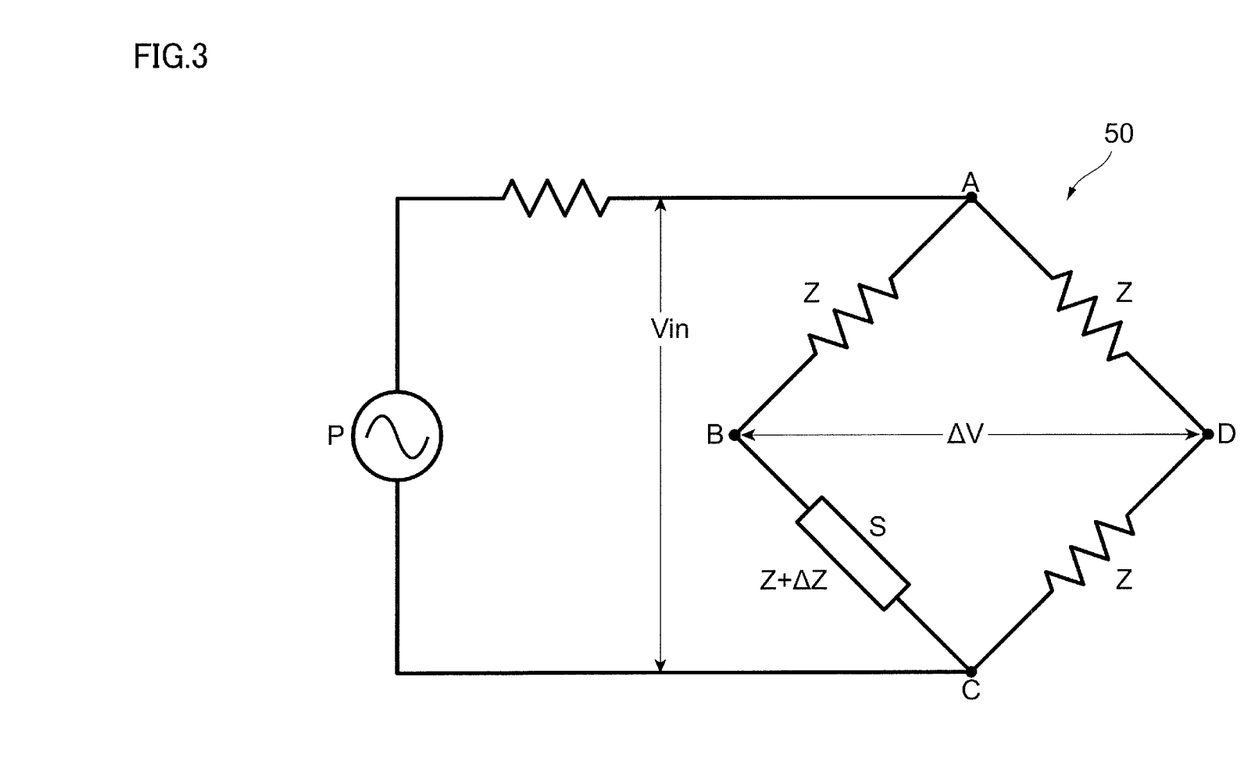
FIG. 3 illustrates an example of a measurement circuit to measure an impedance change.

FIG. 3 illustrates an example of a measurement circuit to measure the impedance change. The measurement circuit is a bridge circuit 50. The bridge circuit 50 includes terminals A, B, C, D. An impedance between the terminals A and B, between the terminals C and D, and between the terminals D and A is set to the impedance Z. Assume that a sample S with a varying impedance is placed between the terminals B and C. That is, three of the four sides constituting the bridge are set to have the impedance Z, and the sample S is set on the remaining side. An AC power source P for supplying alternating currents is connected between the terminals A and C. A voltage Vin is applied between the terminals A and C. A voltage $\Delta V$ between the terminals B and D is measured in the bridge circuit 50.

Assume that the impedance of the sample S changes from Z to Z+$\Delta Z$. When the sample S has the impedance Z, the four sides of the bridge circuit 50 have the impedance Z. Accordingly, the bridge circuit 50 is in equilibrium, and no voltage is generated between the terminals B and D. That is, $\Delta V$ is 0 V. On the other hand, when the sample S has the impedance Z+$\Delta Z$, $\Delta V$ is $\Delta Z/(4Z) \times Vin$ ($\Delta V \approx \Delta Z/(4Z) \times Vin$).

Assuming that the sample S is the magnetic sensor 1 and the bias magnetic field Hb is applied, the above $\Delta Z/Z$ when $\Delta H=1$ corresponds to the sensitivity Zmax/Zb ($\Delta Z/Z=Zmax/Zb$). In this manner, the sensitivity Zmax/Zb of the magnetic sensor 1 is measured using the bridge circuit 50. Note that the sensitivity Zmax/Zb of the magnetic sensor 1 may be measured by any other method than using the bridge circuit 50.

(Relationship Between the Nb Ratio and the Sensitivity Zmax/Zb)

As described in Patent Document 1, $Co_{85}Nb_{12}Zr_3$ containing 12 at % Nb and 3 at % Zr with the balance of Co (which may be denoted as Co12Nb3Zr) has been used as a soft magnetic material to constitute the soft magnetic material layers 101 of the magnetic sensor 1 using the magnetic impedance effect. However, the present inventors have found that increasing the Nb ratio improves the sensitivity Zmax/Zb. Hereinafter, the notation "CoNbZr" is used when respective ratios of Co, Nb, and Zr are not described.

Figure 4A:
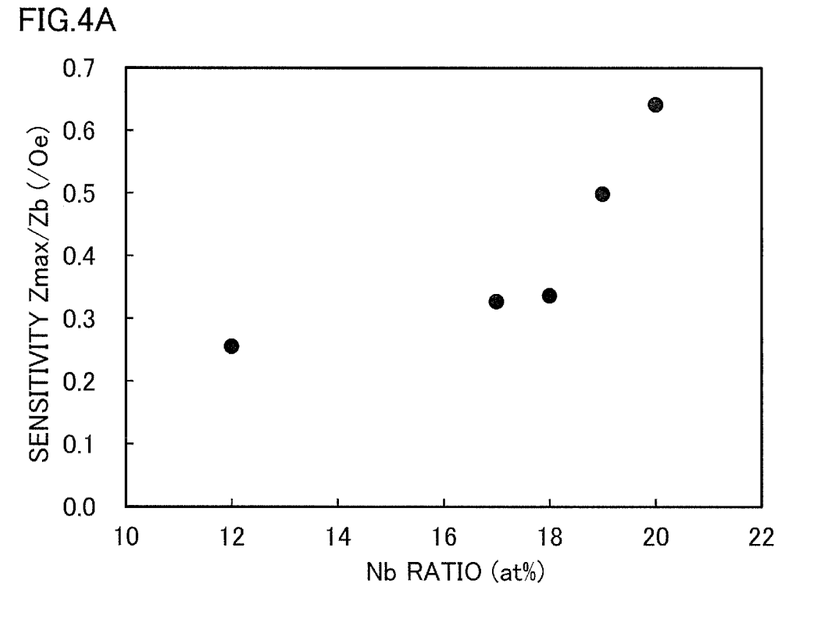
FIGS. 4A and 4B illustrate relationships of an Nb ratio with sensitivity and with an anisotropic magnetic field, where
Figure 4B:
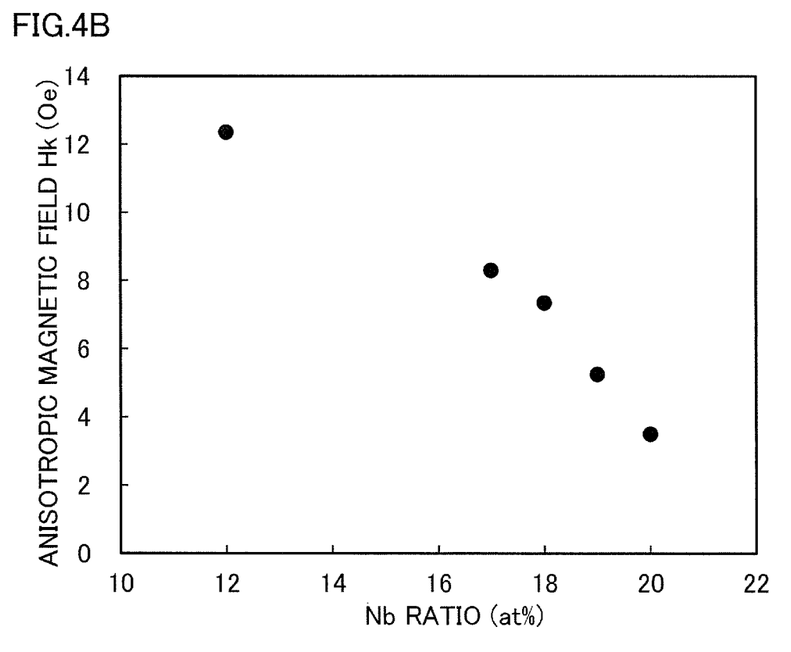

FIGS. 4A and 4B illustrate relationships of the Nb ratio with the sensitivity Zmax/Zb and the anisotropic magnetic field Hk, where FIG. 4A illustrates the relationship with the sensitivity Zmax/Zb and FIG. 4B illustrates the relationship with the anisotropic magnetic field Hk. In FIG. 4A, the horizontal axis represents the Nb ratio (at %), and the vertical axis represents the sensitivity Zmax/Zb (/Oe). In FIG. 4B, the horizontal axis represents the Nb ratio (at %), and the vertical axis represents the anisotropic magnetic field Hk (Oe).

In this example, the magnetic sensor 1 had twenty-four sensitive portions 31 in the sensitive element 30, with each sensitive portion 31 having the length L of 4 mm and the width W of 100 μm and the gap G between the sensitive portions 31 being 50 μm.

In this example, the soft magnetic material layers 101a, 101b, 101c, 101d (see FIG. 1B) were made of CoNbZr, which is an amorphous alloy based on Co. The Nb ratio was varied between 12, 17, 18, 19, and 20 at %. The Zr ratio was fixed at 3 at %. In other words, the Co ratio was reduced in accordance with the increase in the Nb ratio. Each of the soft magnetic material layers 101a, 101b, 101c, 101d was 500 nm thick.

In this example, the magnetic domain suppression layers 102a, 102b (see FIG. 1B) were made of CrTi with an atomic ratio of 1:1. Each of the magnetic domain suppression layers 102a, 102b was 25 nm thick.

In this example, the conductor layer 103 (see FIG. 1B) was made of Ag. The conductor layer 103 was 400 nm thick.

As shown in FIG. 4A, the increase in the Nb ratio improves the sensitivity Zmax/Zb. Meanwhile, as shown in FIG. 4B, the increase in the Nb ratio reduces the anisotropic magnetic field Hk. In other words, such reduction of the anisotropic magnetic field Hk leads to a steeper change in the impedance Z relative to the magnetic field H. This is a likely cause of the improvement of the sensitivity Zmax/Zb.
(Relationship Between the Nb Ratio and Saturation Magnetization Ms)

Figure 5:
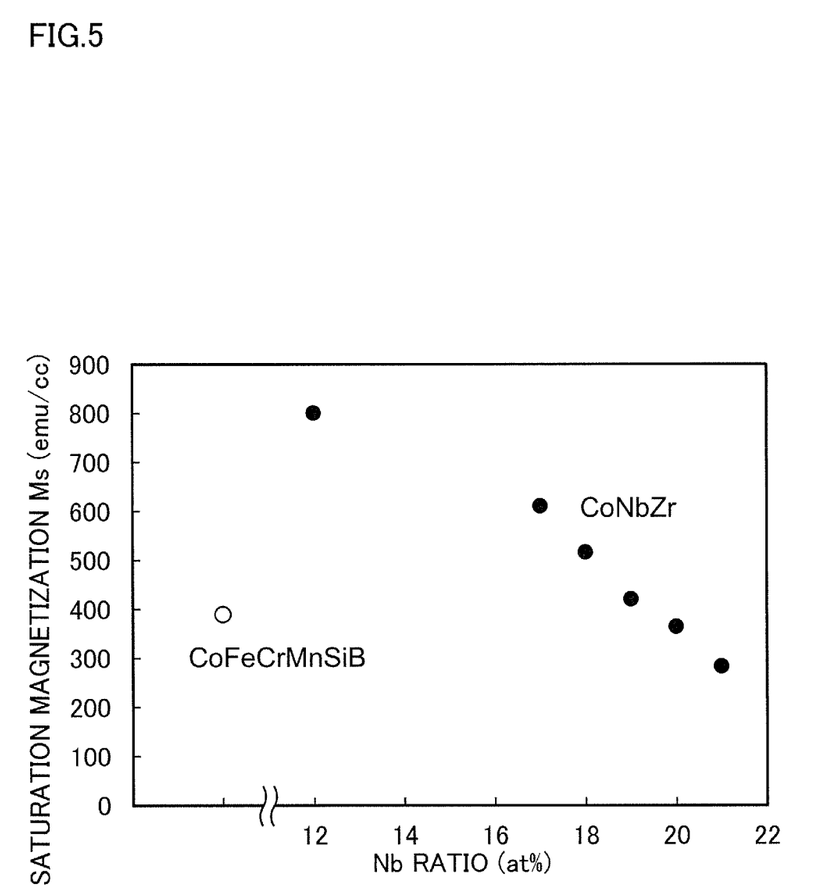
FIG. 5 illustrates relationship between the Nb ratio and saturation magnetization in a soft magnetic material layer.

FIG. 5 illustrates relationship between the Nb ratio and saturation magnetization Ms in the soft magnetic material layer 101. In FIG. 5, the horizontal axis represents the Nb ratio (at %), and the vertical axis represents the saturation magnetization Ms (emu/cc). In this example, a saturation magnetization Ms was measured by providing the soft magnetic material layer 101 on the substrate 10. The state in which magnetic domain walls have disappeared due to a magnetic field is referred to as saturation of the magnetization. The magnetization in the saturated state is referred to as the saturation magnetization Ms.

FIG. 5 shows an amorphous alloy based on Co, which is denoted as CoFeCrMnSiB (shown by the white circle), in addition to CoNbZr (shown by the black circles). Note that CoFeCrMnSiB contains 1.4 at % Fe, 13.8 at % Si, 3.6 at % Mn, 5 at % Cr, and 9.5 at % B with the balance of Co. That is, CoFeCrMnSiB of this example is $Co_{66.7}Fe_{1.4}Cr_5Mn_{3.6}Si_{13.8}B_{9.5}$ (which may be denoted as Co1.4Fe5Cr3.6Mn13.8Si9.5B).

FIG. 5 also shows CoNbZr with the Nb ratio of 21 at %.

As shown in FIG. 5, as the Nb ratio increases, the saturation magnetization Ms of CoNbZr reduces, which means that the magnetization is more easily saturated by the magnetic field. The saturation magnetization Ms of CoFeCrMnSiB is 390 emu/cc, which is close to that of CoNbZr with the Nb ratio of 19 at % (421 emu/cc) and that of CoNbZr with the Nb ratio of 20 at % (365 emu/cc).

The saturation magnetization Ms of CoNbZr with the Nb ratio of 21 at % is as small as 284 emu/cc. When this CoNbZr was used for the magnetic sensor 1, the anisotropic magnetic field Hk was so small that the magnetic sensor 1 did not work as intended. One likely cause of this is that it is difficult to impart the uniaxial anisotropy if the saturation magnetization Ms is too small.
(Relationship Between the Saturation Magnetization Ms and the Sensitivity Zmax/Zb)

Figure 6:
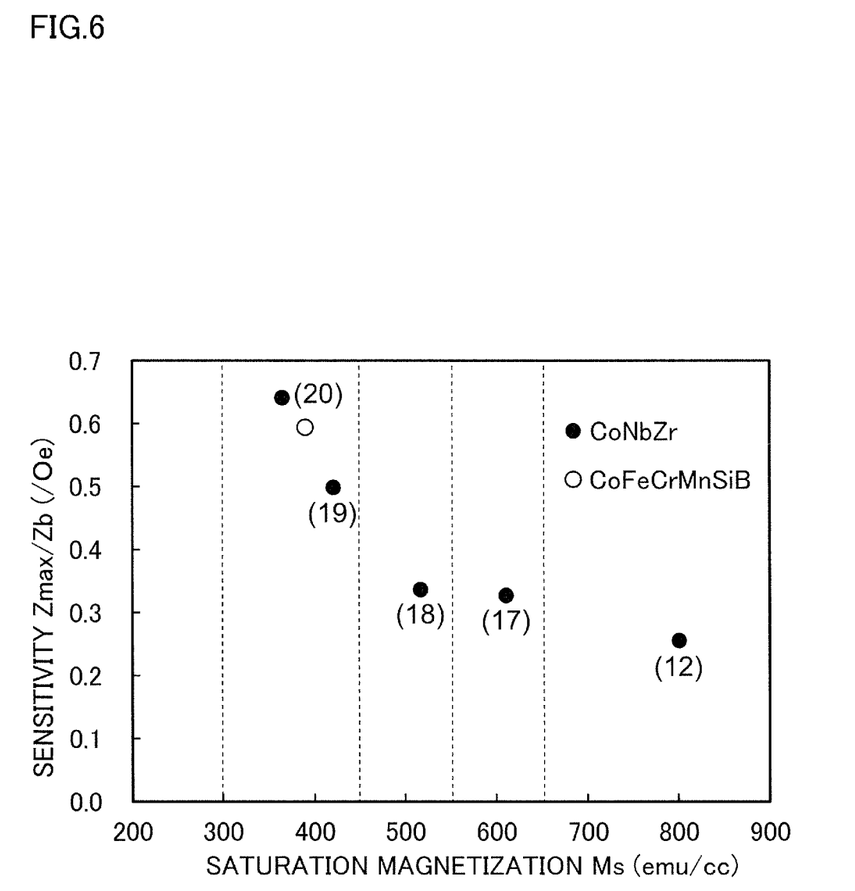
FIG. 6 illustrates relationship between the saturation magnetization and the sensitivity of the magnetic sensor.

FIG. 6 illustrates relationship between the saturation magnetization Ms and the sensitivity Zmax/Zb of the magnetic sensor 1. In FIG. 6, the horizontal axis represents the saturation magnetization Ms (emu/cc), and the vertical axis represents the sensitivity Zmax/Zb (/Oe). FIG. 6 shows CoNbZr (shown by the black circles) with different Nb ratios (at %) and CoFeCrMnSiB (shown by the white circle) described above. The Nb ratio (at %) of each CoNbZr is given in parentheses. In addition, the magnetic sensor 1 using CoFeCrMnSiB has the structure shown in FIG. 1; however, each of the soft magnetic material layers 101a, 101b, 101c, 101d was 250 nm thick.

As shown in FIG. 6, when the saturation magnetization Ms is greater than or equal to 300 emu/cc and less than or equal to 650 emu/cc, the sensitivity Zmax/Zb improves as compared to when the saturation magnetization Ms is 801 emu/cc with the Nb ratio of 12 at %. This holds not only when the soft magnetic material layers 101 are made of CoNbZr but also when the soft magnetic material layers 101 are made of CoFeCrMnSiB. These facts indicate that the sensitivity Zmax/Zb of the magnetic sensor 1 using the magnetic impedance effect will improve when the saturation magnetization Ms of the soft magnetic material layers 101 based on Co is greater than or equal to 300 emu/cc and less than or equal to 650 emu/cc. The phrase "based on Co" means that the Co ratio is 60 at % or more. As described above, if the saturation magnetization Ms is less than 300 emu/cc, the anisotropic magnetic field Hk would be too small, which is undesirable.

As shown in FIG. 4B, the anisotropic magnetic field Hk reduces further when the Nb ratio is greater than 17 at %. Meanwhile, as shown in FIG. 6, when the Nb ratio is greater than 17 at %, the saturation magnetization Ms is less than or equal to 550 emu/cc. Thus, it is more preferred to use the soft magnetic material layers 101 based on Co having the saturation magnetization Ms of greater than or equal to 300 emu/cc and less than or equal to 550 emu/cc. Additionally, as shown in FIG. 6, the sensitivity Zmax/Zb increases further when the saturation magnetization Ms is less than or equal to 450 emu/cc. Thus, it is still more preferred to use the soft magnetic material layers 101 based on Co having the saturation magnetization Ms of greater than or equal to 300 emu/cc and less than or equal to 450 emu/cc.

It is preferred that the Nb ratio in CoNbZr be greater than or equal to 17 at % and less than 21 at %. As described above, the Nb ratio of 21 at % or greater is undesirable because the anisotropic magnetic field Hk would be too small with such an Nb ratio. Also, as shown in FIG. 4B, when the Nb ratio is greater than 17 at %, the anisotropic magnetic field Hk reduces further. Thus, it is more preferred that the Nb ratio be greater than 17 at % and less than 21 at %. Additionally, as shown in FIG. 6, the sensitivity Zmax/Zb increases further when the Nb ratio is greater than 18 at %. Thus, it is still more preferred that the Nb ratio be greater than 18 at % and less than 21 at %.
(Modifications)

Figure 7A:
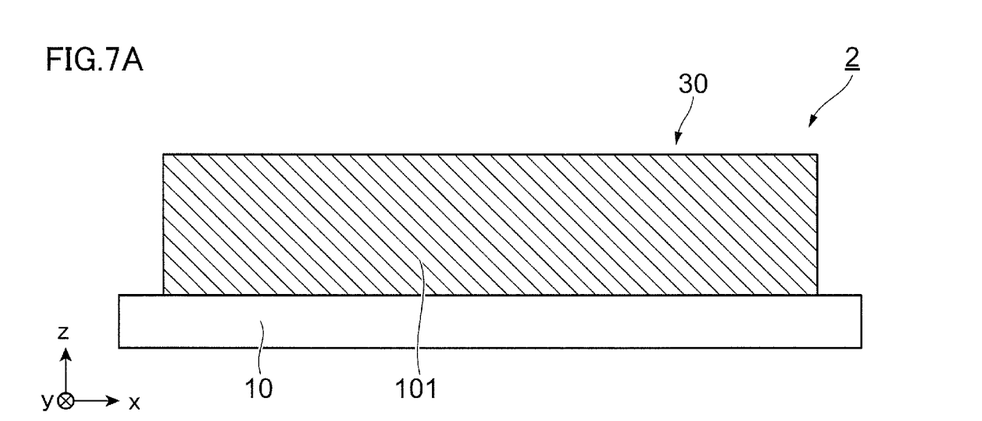
FIG. 7A illustrates a magnetic sensor whose sensitive portions in the sensitive element are each composed of a single soft magnetic material layer.
Figure 7B:
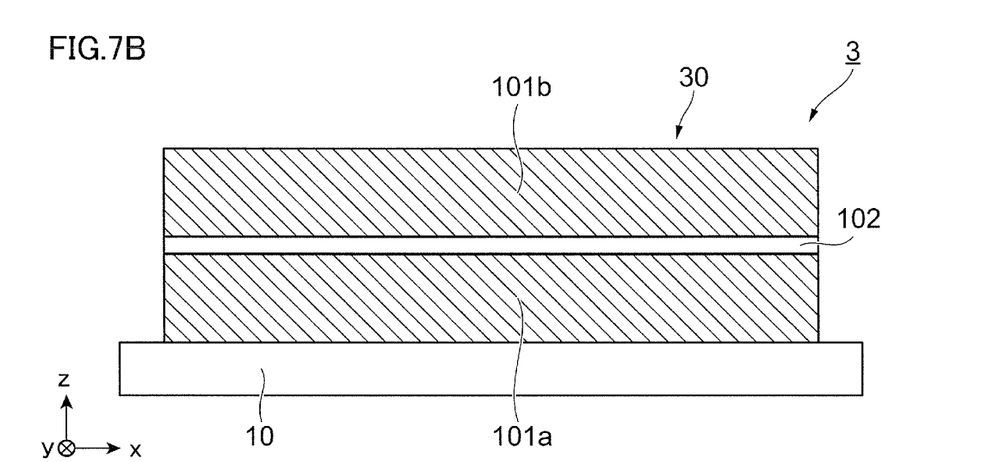
FIG. 7B illustrates a magnetic sensor whose sensitive portions in the sensitive element are each composed of two soft magnetic material layers sandwiching a magnetic domain suppression layer.
Figure 7C:
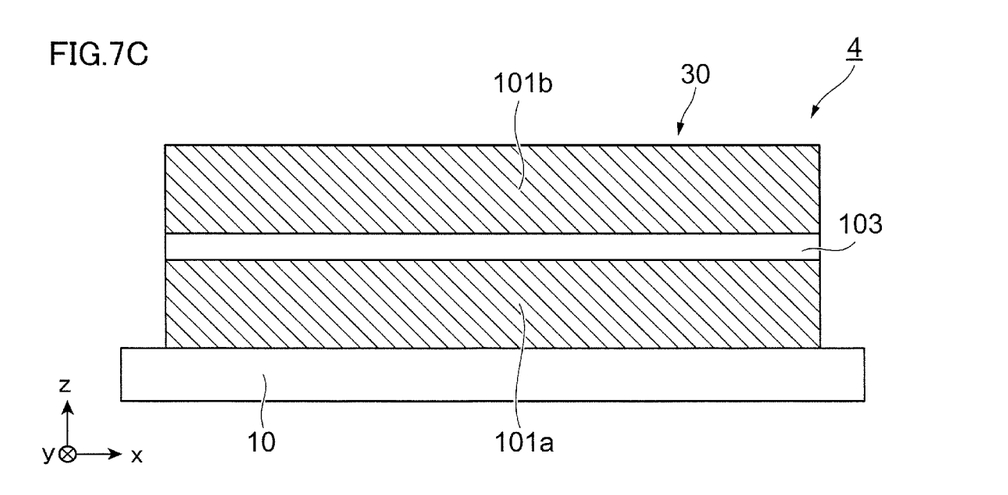
FIG. 7C illustrates a magnetic sensor whose sensitive portions in the sensitive element are each composed of two soft magnetic material layers sandwiching a conductor layer.

FIGS. 7A to 7C are cross-sectional views of some modifications of the magnetic sensor 1. FIG. 7A illustrates a magnetic sensor 2 whose sensitive portions 31 in the sensitive element 30 are each composed of a single soft magnetic material layer 101. FIG. 7B illustrates a magnetic sensor 3 whose sensitive portions 31 in the sensitive element 30 are each composed of two soft magnetic material layers 101 sandwiching a magnetic domain suppression layer 102. FIG. 7C illustrates a magnetic sensor 4 whose sensitive portions 31 in the sensitive element 30 are each composed of two soft magnetic material layers 101 sandwiching a conductor layer 103. In FIGS. 7A to 7C, similar portions to those of the magnetic sensor 1 shown in FIG. 1 are denoted with the same reference numerals.

Each sensitive portion 31 may be composed of a single soft magnetic material layer 101 as shown in FIG. 7A, may be composed of two soft magnetic material layers 101 sandwiching the magnetic domain suppression layer 102 as shown in FIG. 7B, or may be composed of two soft magnetic material layers 101 sandwiching the conductor layer 103 as shown in FIG. 7C. Alternatively, each sensitive portion 31 may be composed of three or more soft magnetic material layers 101.

The magnetic domain suppression layer 102 in FIG. 7B may be replaced with an antiferromagnetic coupling layer that antiferromagnetically couples the upper and lower soft magnetic material layers 101. Also, the magnetic domain suppression layers 102a, 102b of the magnetic sensor 1 shown in FIG. 1B may be replaced with antiferromagnetic coupling layers. As described above, the magnetic domain suppression layer 102 suppresses generation of the closure magnetic domains and antiferromagnetically couples the corresponding upper and lower soft magnetic material layers 101. The antiferromagnetic coupling layer does not have ability to suppress generation of the closure magnetic domains or has poor ability to suppress generation of the closure magnetic domains. Providing the antiferromagnetic coupling layer causes the corresponding upper and lower soft magnetic material layers 101 to be antiferromagnetically coupled to each other, which suppresses a demagnetizing field and thus improves the sensitivity Zmax/Zb of the magnetic sensor. Examples of materials for such an antiferromagnetic coupling layer include Ru or an Ru alloy.

The sensitive portion 31 may include plural layers including the magnetic domain suppression layer(s) 102, the conductor layer(s) 103, and the antiferromagnetic coupling layer(s).

The magnetic sensors 1 to 4 may include, between the substrate 10 and the sensitive element 30, a magnet composed of a hard magnetic material layer (hereinafter denoted as a "thin-film magnet") for applying the bias magnetic field Hb (see FIG. 2). The hard magnetic material refers to a so-called high coercivity material that, once being magnetized by an external magnetic field, keeps its magnetized state even after removal of the external magnetic field. The thin-film magnet may be provided such that a magnetic flux from the magnetic poles N, S passes in the longitudinal direction of the sensitive portions 31 of the sensitive element 30. In the presence of the thin-film magnet between the substrate 10 and the sensitive element 30, the substrate 10 and the thin-film magnet can be collectively viewed as a substrate.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art without departing from the scope and sprit of the present invention. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A magnetic sensor comprising:
   a non-magnetic substrate; and
   a sensitive element disposed on the substrate, the sensitive element having a longitudinal direction and a transverse direction, the sensitive element having a uniaxial magnetic anisotropy in a direction intersecting the longitudinal direction, the sensitive element being configured to sense a magnetic field by a magnetic impedance effect, the sensitive element including a soft magnetic material layer made of an amorphous alloy based on Co, the soft magnetic material layer having a saturation magnetization of greater than or equal to 300 emu/cc and less than or equal to 650 emu/cc,
   wherein the sensitive element includes a plurality of the soft magnetic material layers, and
   wherein the sensitive element includes a magnetic domain suppression layer between the plurality of the soft magnetic material layers, the magnetic domain suppression layer being configured to suppress generation of closure magnetic domains in the soft magnetic material layers.

2. The magnetic sensor according to claim 1, wherein the soft magnetic material layer has a saturation magnetization of greater than or equal to 300 emu/cc and less than or equal to 550 emu/cc.

3. The magnetic sensor according to claim 2, wherein the soft magnetic material layer has a saturation magnetization of greater than or equal to 300 emu/cc and less than or equal to 450 emu/cc.

4. A magnetic sensor comprising:
   a non-magnetic substrate;
   a sensitive element disposed on the substrate, the sensitive element having a longitudinal direction and a transverse direction, the sensitive element having a uniaxial magnetic anisotropy in a direction intersecting the longitudinal direction, the sensitive element being configured to sense a magnetic field by a magnetic impedance effect, the sensitive element including a soft magnetic material layer made of an amorphous alloy containing 3 at % Zr and greater than or equal to 17 at % and less than 21 at % Nb with a balance of Co,
   wherein the sensitive element includes a plurality of the soft magnetic material layers, and
   wherein the sensitive element includes a magnetic domain suppression layer between the plurality of the soft magnetic material layers, the magnetic domain suppression layer being configured to suppress generation of closure magnetic domains in the soft magnetic material layers.

5. The magnetic sensor according to claim 4, wherein the soft magnetic material layer contains greater than 17 at % and less than 21 at % Nb.

6. The magnetic sensor according to claim 5, wherein the soft magnetic material layer contains greater than 18 at % and less than 21 at % Nb.

7. The magnetic sensor according to claim 1, wherein the sensitive element includes a non-magnetic conductor layer between the plurality of the soft magnetic material layers, the conductor layer having higher conductivity than the soft magnetic material layers.

8. The magnetic sensor according to claim 1, wherein the sensitive element includes a non-magnetic antiferromagnetic coupling layer between the plurality of the soft magnetic material layers, the antiferromagnetic coupling layer being configured to antiferromagnetically couple the soft magnetic material layers.

9. The magnetic sensor according to claim 4, wherein the sensitive element includes a non-magnetic conductor layer between the plurality of the soft magnetic material layers, the conductor layer having higher conductivity than the soft magnetic material layers.

10. The magnetic sensor according to claim 4, wherein the sensitive element includes a non-magnetic antiferromagnetic coupling layer between the plurality of the soft magnetic material layers, the antiferromagnetic coupling layer being configured to antiferromagnetically couple the soft magnetic material layers.

* * * * *